United States Patent
Rizzolo et al.

(10) Patent No.: US 11,942,126 B2
(45) Date of Patent: Mar. 26, 2024

(54) SELECTIVELY BIASING MAGNETORESISTIVE RANDOM-ACCESS MEMORY CELLS

(71) Applicant: International Business Machines Corporation, Armonk, NY (US)

(72) Inventors: Michael Rizzolo, Delmar, NY (US); Saba Zare, White Plains, NY (US); Virat Vasav Mehta, Menands, NY (US); Eric Raymond Evarts, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 311 days.

(21) Appl. No.: 17/331,008

(22) Filed: May 26, 2021

(65) Prior Publication Data
US 2022/0383921 A1 Dec. 1, 2022

(51) Int. Cl.
| | |
|---|---|
| *G11C 11/16* | (2006.01) |
| *H10B 61/00* | (2023.01) |
| *H10N 50/01* | (2023.01) |
| *H10N 50/10* | (2023.01) |
| *H10N 50/80* | (2023.01) |
| *H10N 50/85* | (2023.01) |

(52) U.S. Cl.
CPC ............ *G11C 11/161* (2013.01); *H10B 61/00* (2023.02); *H10N 50/01* (2023.02); *H10N 50/10* (2023.02); *H10N 50/80* (2023.02); *H10N 50/85* (2023.02)

(58) Field of Classification Search
None
See application file for complete search history.

(56) References Cited

U.S. PATENT DOCUMENTS

| | | | |
|---|---|---|---|
| 6,413,788 B1* | 7/2002 | Tuttle | B82Y 10/00 257/E27.005 |
| 6,803,615 B1 | 10/2004 | Sin et al. | |
| 6,852,550 B2 | 2/2005 | Tuttle et al. | |
| 7,033,881 B2 | 4/2006 | Gaidis et al. | |
| 7,083,990 B1 | 8/2006 | Leuschner | |
| 7,782,660 B2 | 8/2010 | Assefa et al. | |
| 9,691,969 B2 | 6/2017 | Chuang et al. | |
| 11,758,819 B2* | 9/2023 | van der Straten | G11C 11/161 257/421 |
| 2005/0274997 A1 | 12/2005 | Gaidis et al. | |

(Continued)

FOREIGN PATENT DOCUMENTS

| | | |
|---|---|---|
| CN | 110890115 A | 3/2020 |
| JP | 2006005342 A | 1/2006 |

(Continued)

OTHER PUBLICATIONS

International Search Report and Written Opinion, International Application No. PCT/EP2022/062788, dated Oct. 5, 2022, 12 pgs.

*Primary Examiner* — Kevin M Bernatz
(74) *Attorney, Agent, or Firm* — Robert J. Shatto

(57) ABSTRACT

Provided is a magnetoresistive random-access memory (MRAM) cell. The MRAM cell comprises a top contact, a hard mask layer below the top contact, and a magnetic tunnel junction (MTJ) below the hard mask layer. The MRAM cell further comprises a diffusion barrier below the MTJ, a bottom contact below the diffusion barrier, and a magnetic liner arranged around the bottom contact.

14 Claims, 12 Drawing Sheets

(56) References Cited

U.S. PATENT DOCUMENTS

| | | | |
|---|---|---|---|
| 2006/0022286 A1* | 2/2006 | Leuschner | H01L 21/76874 |
| | | | 257/E27.005 |
| 2007/0183187 A1* | 8/2007 | Guo | G11C 11/16 |
| | | | 365/158 |
| 2008/0020491 A1 | 1/2008 | Ingvarsson et al. | |
| 2009/0218644 A1* | 9/2009 | Lee | H01L 23/53238 |
| | | | 257/E23.141 |
| 2016/0336506 A1 | 11/2016 | Annunziata et al. | |
| 2018/0350432 A1 | 12/2018 | Sasaki | |
| 2020/0220072 A1 | 7/2020 | Marchack et al. | |
| 2021/0013399 A1 | 1/2021 | Tseng et al. | |
| 2022/0180911 A1* | 6/2022 | Zare | H10B 61/00 |
| 2022/0238794 A1* | 7/2022 | Rizzolo | H10N 50/01 |

FOREIGN PATENT DOCUMENTS

| | | | | |
|---|---|---|---|---|
| WO | WO-2009117228 A2 * | 9/2009 | | G11C 11/16 |
| WO | 2022122469 A1 | 6/2022 | | |

* cited by examiner

SELECTIVELY BIASING MAGNETORESISTIVE RANDOM-ACCESS MEMORY CELLS

BACKGROUND

The present disclosure relates to the electrical, electronic, and computer fields. In particular, the present disclosure relates to magnetoresistive random-access memory (MRAM) cells that are fabricated so as to selectively bias the cells.

MRAM is a type of non-volatile memory used in computers and other electronic devices to store data. Unlike conventional read-access memory (DRAM), which stores data using as electric charge or current flows (e.g., using capacitors), MRAM stores the data in magnetic domains using magnetic storage elements. The magnetic storage elements are formed from two ferromagnetic plates, each of which can hold a magnetization, separated by a thin insulating layer. The plate's magnetization can be changed to match that of an external field to store memory.

SUMMARY

Embodiments of the present disclosure include a magnetoresistive random-access memory (MRAM) cell. The MRAM cell comprises a top contact, a hard mask layer below the top contact, and a magnetic tunnel junction (MTJ) below the hard mask layer. The MRAM cell further comprises a diffusion barrier below the MTJ, a bottom contact below the diffusion barrier, and a magnetic liner arranged around the bottom contact.

Advantageously, embodiments of the present disclosure include a magnetic liner around the bottom contact. The magnetic liner may be formed with a specific size so as to selectively bias the resulting MRAM cell. For example, the MRAM cell may be biased such that it is easier to write to a high value or a low value, depending on the dimensions of the magnetic liner. This may be advantageous in certain applications, such as by allowing an artificial intelligence model written into the memory to be pre-biased or in storing a security key in the memory.

In some embodiments, the size of the bottom contact and liner is based on the desired bias condition for the MRAM cell. This may allow each MRAM cell in a memory array to be hardware biased based on the intended use of the memory device that includes the memory array.

Additional embodiments of the present disclosure include an MRAM cell. The MRAM cell comprises a top contact, a hard mask layer below the top contact, and a MTJ below the hard mask layer. The MRAM cell further comprises a diffusion barrier below the MTJ, and a bottom contact below the diffusion barrier. The bottom contact includes a ferromagnetic material fill.

Advantageously, embodiments of the present disclosure include a magnetic fill in the bottom contact. The magnetic fill may be formed with a specific size so as to selectively bias the resulting MRAM cell. For example, the MRAM cell may be biased such that it is easier to write to a high value or a low value, depending on the dimensions of the bottom contact. This may be advantageous in certain applications, such as by allowing an artificial intelligence model written into the memory to be pre-biased or in storing a security key in the memory.

In some embodiments, the size of the bottom contact and the MTJ is based on the desired bias condition for the MRAM cell. This may allow each MRAM cell in a memory array to be hardware biased based on the intended use of the memory device that includes the memory array. Additionally, controlling the size of the MTJ and the bottom contact, as opposed to just the bottom contact, may allow for a larger range of pre-biasing, as well as a more simplified fabrication process.

Additional embodiments of the present disclosure include a method, system, and computer program product for forming a MRAM device in which individual MRAM cells are selectively biased. The method comprises determining a set of MRAM cells in a memory array to be hardware biased. The method further comprises determining, for each MRAM cell in the set of MRAM cells, a bias condition. The method further comprises determining, for each MRAM cell in the set of MRAM cells, a critical dimension based on the bias condition of the MRAM cell and a type of structure for the MRAM cell. The method further comprises fabricating the memory array using the determined critical dimension for each MRAM cell in the set of MRAM cells.

Advantageously, embodiments of the present disclosure allow individual MRAM cells to be pre-biased into a specific state. For example, the MRAM cell may be biased such that it is easier to write to a high value or a low value, depending on the critical dimension of the fabricated MRAM cell. This may be advantageous in certain applications, such as by allowing an artificial intelligence model written into the memory to be pre-biased or in storing a security key in the memory.

In some embodiments, the set of MRAM cells to be hardware biased is determined based on an intended use of the MRAM device. This may allow the MRAM device to be more specifically tailored to the specific application of the MRAM device. For example, an MRAM device for use in an artificial intelligence model may be selectively biased such that it is particularly well adapted for pre-biasing the artificial intelligence model.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

Figure 1:
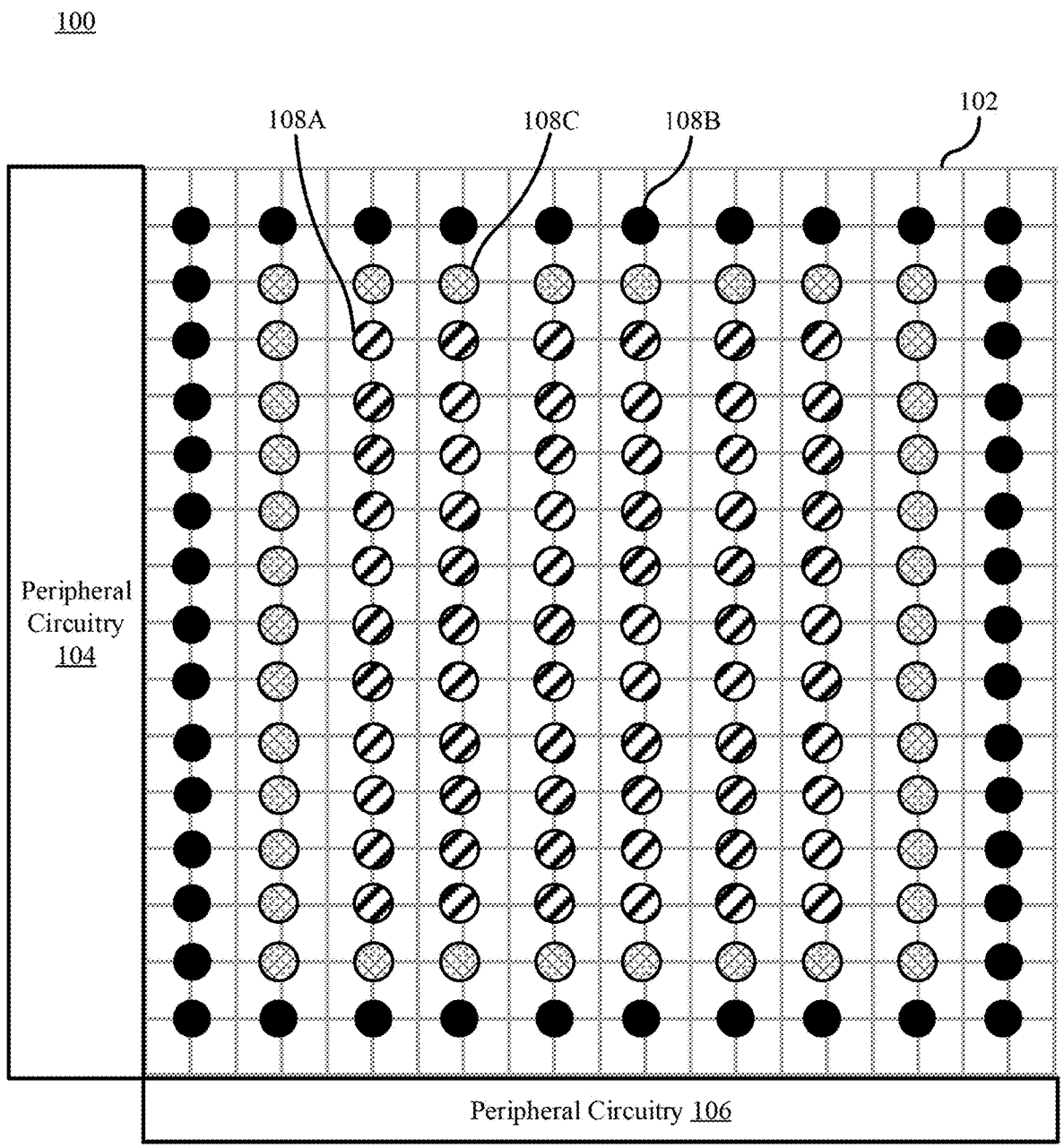
FIG. 1 depicts an example memory device in which individual memory cells are selectively biased into one of three bias conditions, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Aspects of the present disclosure relate generally to the electrical, electronic, and computer fields, and in particular to magnetoresistive random-access memory (MRAM) cells that are fabricated so as to selectively bias the cells and methods of manufacturing the same. While the present disclosure is not necessarily limited to such applications, various aspects of the disclosure may be appreciated through a discussion of various examples using this context.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

Turning now to an overview of technologies that are more specifically relevant to aspects of the present disclosure, in general, a MRAM cell refers to any material or combination of materials capable of storing a bit of information using magnetic storage elements. MRAM cell values, which can be binary (1 or 0) or analog (e.g., 0.65), are stored in the memory cell as a function of the cell's electrical resistance, similar to how values are stored in resistive random-access memory (ReRAM or RRAM) cells and/or memristors. In other words, the relative orientation of the magnetization of the plates within the MRAM cell affects the electrical resistance of the MRAM cell. This electrical resistance can be measured by passing a current through the MRAM cell, and the measured electrical resistance can be converted into a value.

In magnetic tunnel junction (MTJ) devices, the current-induced magnetization is the main phenomenon of interest for MRAM cells/devices. Recognizing that certain applications benefit from biasing individual memory cells, the inventors have determined that there is a need to have variability in switching of the MTJ cells in STT-MRAM with current (or write voltage) differences. For example, the inventors have recognized that in STT-MRAM arrays, there are some unintentional changes at the edge of the array such as MTJ sizes and the asymmetry coming from the physical location of a cell. These result in the corresponding arrays being less than ideal as some of the cells behave differently from other cells based on their location in the array. Additionally, as recognized by the inventors, intentional biasing of the MRAM cells can be used as building block for AI applications or for security purposes.

Embodiments of the present disclosure may address the above and other problems with current MRAM technology. Embodiments of the present disclosure include methods and structures for intentionally hardware biasing individual memory cells in a memory array. Biasing the MRAM cells changes how easy it is to program the MRAM cell into particular state (e.g., a state associated with a 0 or a 1 bit value). In some embodiments, one or more of the MRAM cells may be biased such that they are only capable of having a particular memory state (e.g., it is always a 0 or always a 1).

Hardware biasing of select memory cells may be used in applications where artificial intelligence (AI) models are embedded in the memory array, such that certain memory cells that contain values for select portions of the AI model (e.g., specific weights in a deep neural network (DNN) model) are pre-biased to favor a particular state. This can be done to pre-bias the AI model before the training and computer learning take place. Other example implementations in which embodiments of the present disclosure may be used include when a security key is being programmed into an individual array, such as for security applications and/or system controller apps, and when particular MRAM cells are intentionally biased to remove known issues with memory arrays relating to manufacturing processes (e.g., to reduce the number of dummy bits and increase the density of the memory device).

Embodiments of the present disclosure include a method for intentionally pre-biasing MRAM cells of a memory array. The method may include determining which MRAM cells in the memory array should be biased. The memory array may be biased according to the specific implementation in which the memory array will be used (e.g., an AI model or security key). The method may also include determining a bias condition for each of the MRAM cells in the memory array. The bias condition for an MRAM cell may be a type or level of hardware biasing for that MRAM cell. In some embodiments, there may be two distinct bias conditions, while in other embodiments there may be more than two distinct bias conditions.

The MRAM cells that are to be biased and the bias condition to apply to the MRAM cells may depend on the particular application/implementation of the memory array. For example, in some embodiments the MRAM cells may be biased to reduce design issues with MRAM arrays (especially along the edges of the array), while in other embodiments, individual cells may be biased in order to pre-bias an AI model or security key into the memory array. The number of MRAM cells to be biased, which MRAM cells are to be biased, and which bias conditions (and how many bias conditions) are to be used may all depend on the specific implementation. For example, different AI models may have different pre-bias conditions such that different MRAM cells are hardware biased for each AI model.

Once the MRAM cells to be biased are determined and bias conditions are determined for each such MRAM cell, the method may include fabricating the MRAM array. Fabricating the MRAM array may utilize known or conventional fabrications processes or operations to create MRAM cell structures that have a particular hardware bias. The bias condition can be determined by the volume of magnetic material in underlying bottom contact or interconnects. In other words, the relative volume of magnetic material below the pre-programmed litho of the bottom contact (assuming fixed magnetic liner thickness) determines how the MRAM cell is biased. Embodiments include biasing the MRAM circuit or array based on the volume of bottom electrode magnetic material to pre-program, and to be used by itself in MRAM arrays. Some embodiments change the bias of individual MRAM cells by doing one or more of a) changing the microstud size below the MTJ with a magnetic liner size, b) increasing the Co liner thickness with the same microstud size, and/or c) changing the size of MTJ cell. Several example MRAM cell structures are disclosed herein for selectively biasing the MRAM cell.

Figure 5:
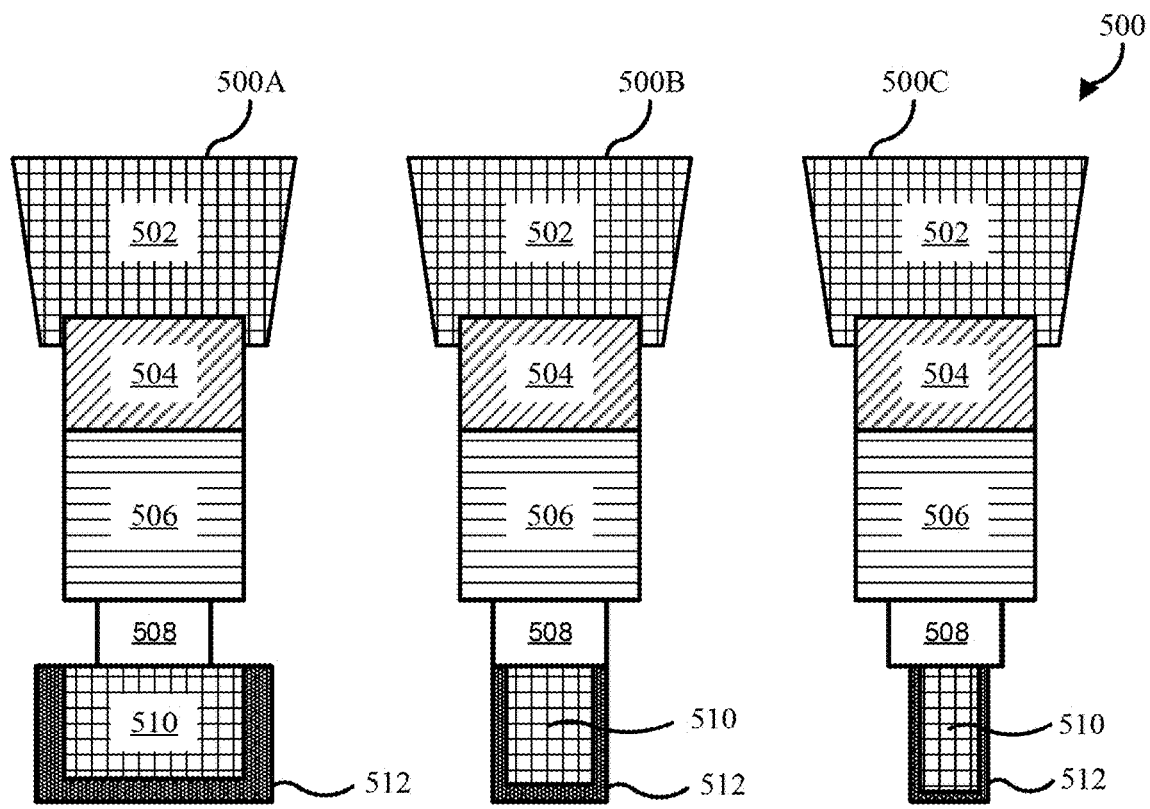
FIG. 5 is a cross-sectional view depicting a first example MRAM cell structure for selectively biasing the MRAM cell, in accordance with embodiments of the present disclosure.
Figure 6:
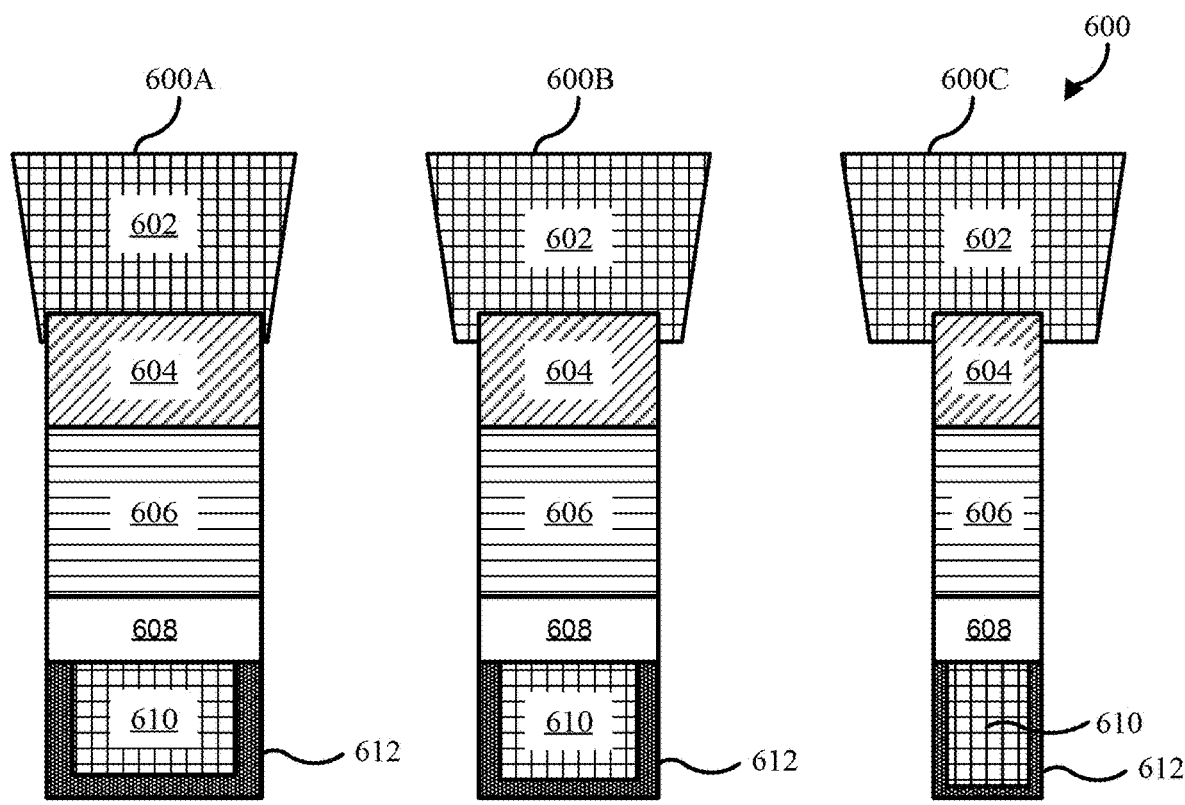
FIG. 6 is a cross-sectional view depicting a second example MRAM cell structure for selectively biasing the MRAM cell, in accordance with embodiments of the present disclosure.

Some embodiments of the present disclosure utilize a liner added to the bottom contact of an MRAM cell that includes a magnetic tunnel junction (MTJ). The liner consists of a magnetic material, such as cobalt, iron, nickel, magnetic metal alloys (e.g., nickel alloys), and/or rare earth alloys such as neodymium alloys (e.g., NdFeB) and samarium-cobalt alloys), among others. These embodiments can be used to control (e.g., tune) the bias condition of the MRAM cell by varying the size of the bottom contact and magnetic liner (e.g., as shown in FIG. 5), by varying the size of the magnetic liner without changing the size of the bottom contact, and/or by varying the dimensions of the entire MTJ stack and bottom contact (e.g., as shown in FIG. 6).

Figure 7:
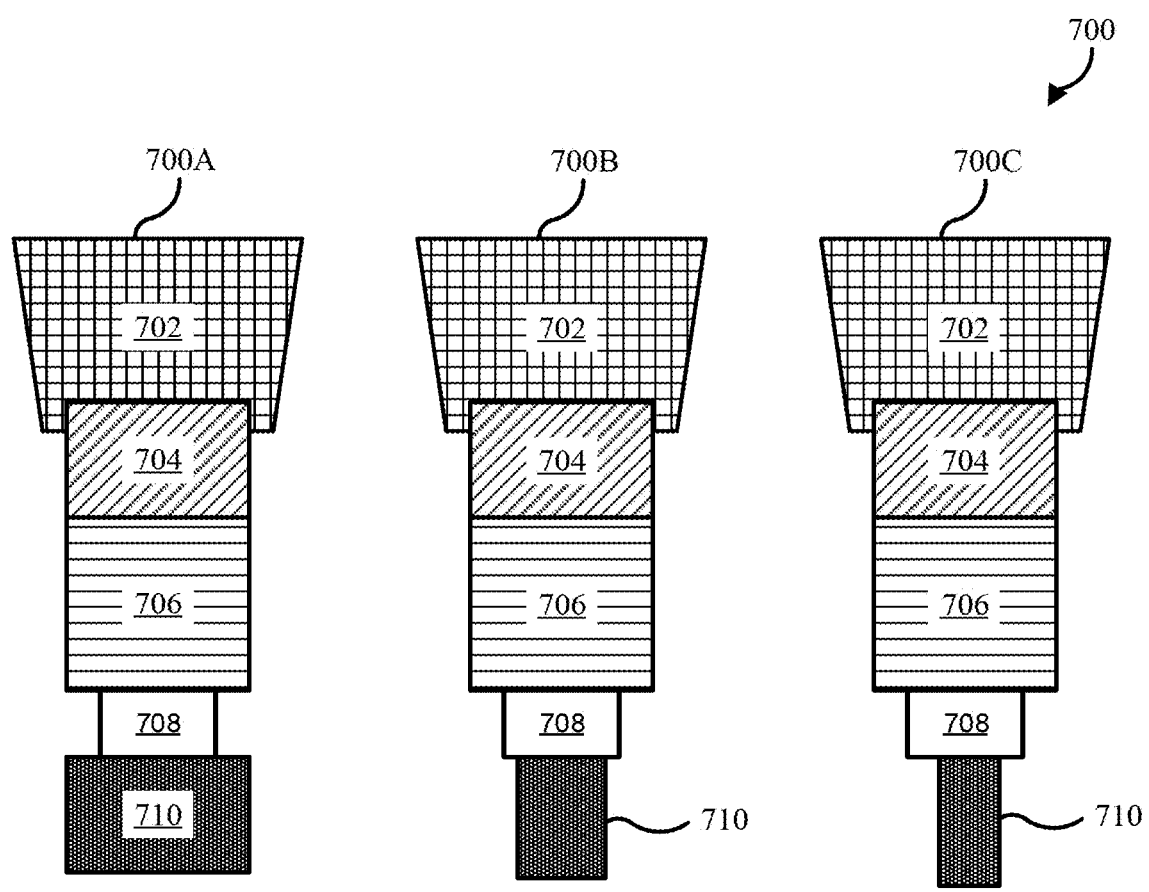
FIG. 7 is a cross-sectional view depicting a third example MRAM cell structure for selectively biasing the MRAM cell, in accordance with embodiments of the present disclosure.

Some embodiments of the present disclosure replace or substantially replace the typical bottom contact of the MRAM cell with a magnetic material. For example, in some embodiments, the entire bottom contact may be made out of a magnetic material, while in other embodiments, the bulk of the bottom contact may be made out of a magnetic material (e.g., with a Cu liner for increased electrical conductivity). These embodiments can be used to control the bias condition of the MRAM cell by carrying the size of the bottom magnetic contact. An example of this embodiment is shown in FIG. 7, which includes MRAM cells having three different bias conditions. In some embodiments, two or more of the above three ways of biasing MRAM cells in a memory array are all included in the same array. For example, some MRAM cells in the array may utilize a liner, while other MRAM cells in the memory array may utilize a magnetic bottom contact (e.g., a magnetic fill).

It is to be understood that the aforementioned advantages are example advantages and should not be construed as limiting. Embodiments of the present disclosure can contain all, some, or none of the aforementioned advantages while remaining within the spirit and scope of the present disclosure.

Turning now to the figures, FIG. 1 depicts an example memory device 100 in which individual memory cells are selectively biased into one of three bias conditions, in accordance with embodiments of the present disclosure. The memory device 100 includes a memory array 102 and peripheral circuitry 104 and 106. The memory array 102 includes a plurality of MRAM cells that each store individual bits of data, and the peripheral circuitry 104, 106 includes various integrated circuits for reading the data from, and writing the data to, the memory array 102. The MRAM array 102 may include a plurality of hardware biased MRAM cells, and the arrangement of the biased cells shown in FIG. 1 may be particularly useful in offsetting issues created by MRAM fabrication that causes some MRAM cells along edges of the memory array 102 to be biased differently than MRAM cells in the middle of the memory array 102.

As shown in FIG. 1, each MRAM cell in the memory array 102 is in one of three different bias conditions. The MRAM cells 108A in the center of the MRAM array 102 are hardware biased into a first bias condition. Similarly, the MRAM cells 108B along the edge of the memory array 102 are hardware biased into a second bias condition, while the MRAM cells 108C between the edge MRAM cells 108B and the interior MRAM cells 108A are hardware biased into a third bias condition. Each bias condition may determine the ease with which the MRAM cells can be written to a particular value. For example, MRAM cells 108A with the first bias condition may be effectively unbiased such that it is equally easy to write the cell to a 1 as it is to write the cell to a 0. Meanwhile, MRAM cells 108B with the second bias condition may be easier to write to a 1 than to a 0, and MRAM cells 108C with the third bias condition may be easier to write to a 0 than to a 1.

Figure 2:
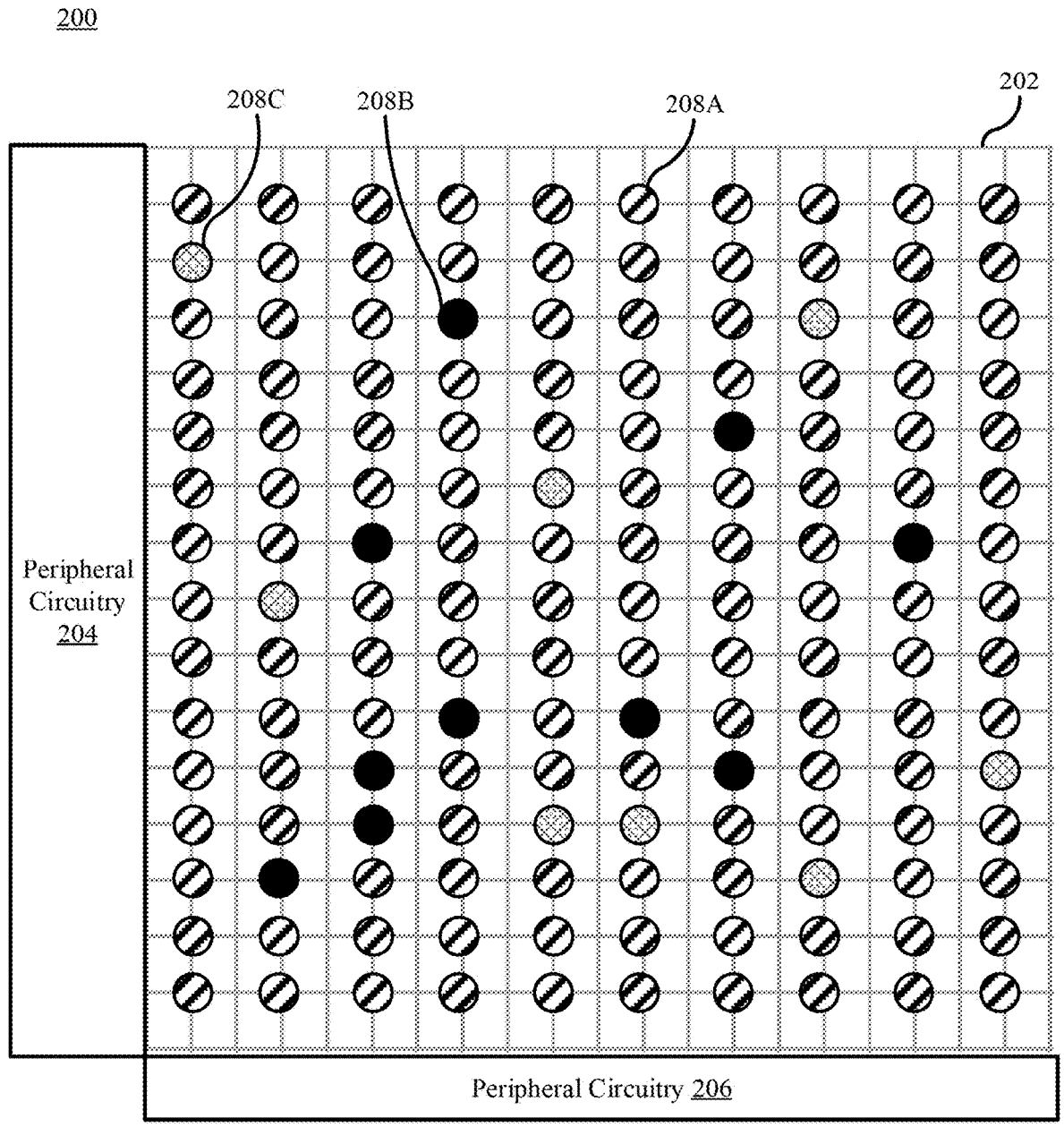
FIG. 2 depicts a second example memory device in which individual memory cells are selectively biased into one of three bias conditions, in accordance with embodiments of the present disclosure.

Referring now to FIG. 2, depicted is a second example memory device 200 in which individual memory cells are selectively biased into one of three bias condition, in accordance with embodiments of the present disclosure. The memory device 200 includes a memory array 202 and peripheral circuitry 204 and 206. The memory array 202 includes a plurality of MRAM cells that each store individual bits of data, and the peripheral circuitry 204, 206 includes various integrated circuits for reading the data from, and writing the data to, the memory array 202. The MRAM array 202 may include a plurality of hardware biased MRAM cells.

Similar to the memory array 102 shown in FIG. 1, each MRAM cell in the memory array 202 is in one of three different bias conditions. Additionally, each bias condition may determine the ease with which the MRAM cells can be written to a particular value. For example, MRAM cells 208A with the first bias condition may be effectively unbiased such that it is equally easy to write the cell to a 1 as it is to write the cell to a 0. Meanwhile, MRAM cells 208B with the second bias condition may be easier to write to a 1 than to a 0, and MRAM cells 208C with the third bias condition may be easier to write to a 0 than to a 1.

Unlike the memory array 102, however, the MRAM cells in the memory array 202 having the same bias condition are not as grouped together. Instead, each bias condition 108A-C is more spread out through the array. This is because the arrangement of the biased cells shown in FIG. 2 corresponds to an example hardware biasing of MRAM cells so as to pre-bias an AI model or embed a security key in the memory array 202. As such, the bias condition of each MRAM cell does not correspond to its location in the memory array 202, as was the case with the memory array 102, but instead the bias condition of each MRAM cell is based on what information will be stored in that MRAM cell (e.g., which node of the AI model or portion of the security key is stored in that MRAM cell).

Figure 3:
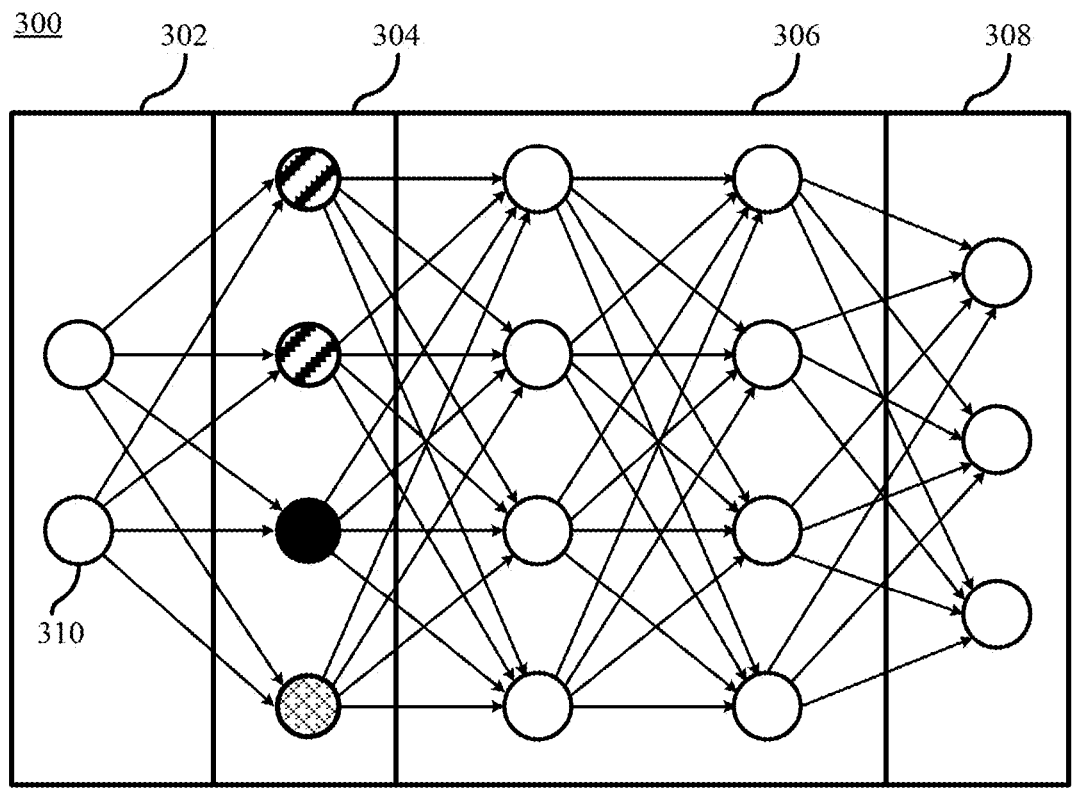
FIG. 3 is a diagram depicting an example deep neural network that includes a set of biased nodes, in accordance with embodiments of the present disclosure.
Figure 4:
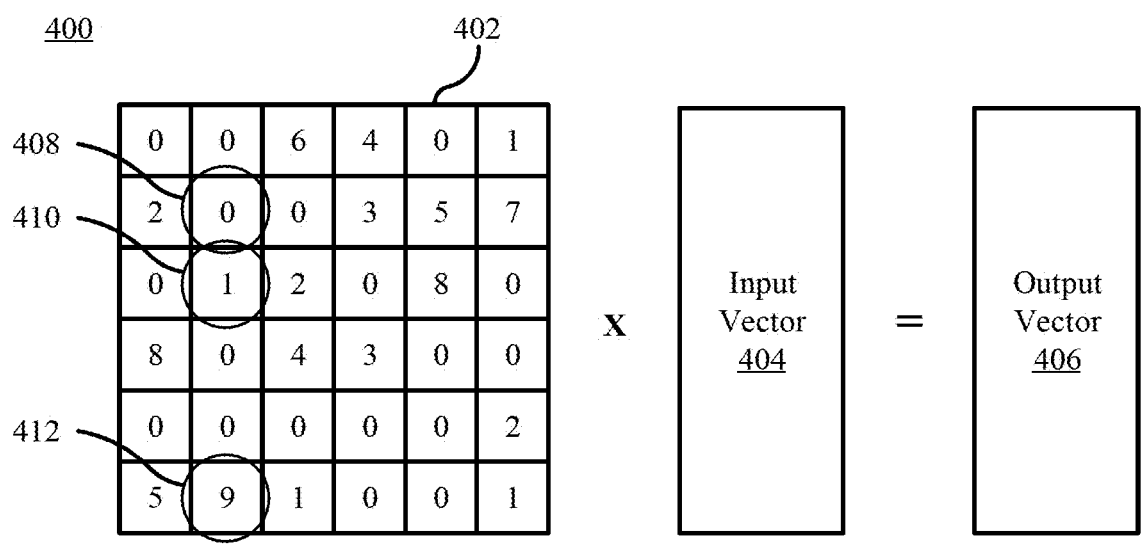
FIG. 4 is a diagram depicting a biased weight matrix that can be used to convert an input vector into an output vector via matrix multiplication, in accordance with embodiments of the present disclosure.

Referring now to FIG. 3, shown is a diagram depicting an example deep neural network (DNN) 300 that includes a set of biased nodes, in accordance with embodiments of the present disclosure. The DNN 300 includes a plurality of nodes 310. The nodes 310 are grouped into an input layer, three hidden layers 304, 306, and an output layer 308. One of the hidden layers 304 includes biased nodes, with each of the three bias conditions for the nodes 310 being associated with a different pattern on the node 310. The biased nodes in the biased hidden layer 304 may be hardware biased by physically biasing the MRAM cells that hold the values (e.g., weights) for the biased nodes. By biasing the nodes in the biased hidden layer 304, the weight matrix 402 can be biased, as shown in the diagram 400 in FIG. 4. For example, a first cell 408 in the biased weight matrix 402 can be biased to a value of 0, whereas a second cell 410 in the weight matrix 402 can be biased low (e.g., shown as a 1) and a third cell 412 in the weight matrix 402 can be biased high (e.g., shown as a 9). As such, the conversion of an input vector 404 into an output vector 406 via matrix multiplication can be hardware biased, as shown in FIG. 4.

Referring now to FIG. 5, shown is a cross-sectional view depicting a first example MRAM cell structure for selectively biasing the MRAM cell, in accordance with embodiments of the present disclosure. In particular, FIG. 5 shows three different MRAM cells 500 of the same basic structure, with each of the MRAM cells 500 having a different bias condition. The embodiment(s) shown in FIG. 5 include a structure with an external magnetic underlayer (EMU) liner underneath the MTJ with different sizes in the microstud. The bottom contact liner is comprised of a ferromagnetic liner and exerts a different magnetic field on the MTJ and therefore different write/read voltages.

Each MRAM cell 500 includes a top contact 502, a hard mask 504, an MTJ 506, a barrier 508 (also known as a diffusion barrier), a bottom contact 510, and a magnetic liner 512. In general, the MTJ 506 includes two ferromagnets separated by an insulator, which is also referred to as a tunnel barrier. Each of these components may actually be made up of one or more individual layers of material, and other material layers may be found in, directly on top of, or directly below the MTJ 506.

For example, the MTJ 506 may comprise a free layer, a tunnel barrier below the free layer, and a reference layer below the tunnel barrier. The free layer and the reference layer may be made up of ferromagnetic materials, while the tunnel barrier may be an insulating material. For example, in some embodiments, the tunnel barriers may include one or more layers of epitaxial (crystalline) MgO. In other embodiments, other suitable materials (e.g., amorphous aluminum oxide) may be used as the tunnel barrier. The free layer may connect to the top contact of the MRAM cell, while the reference layer may connect to the bottom contact. In some embodiments, a heavy metal layer (e.g., Pt, Ta) separates the free layer and/or the reference layer from the contacts. The MTJ 506 may further include dielectric materials to isolate the MTJ from components other than the contacts. For example, dielectric encapsulation using a low-k material may be formed on the lateral edges of the MTJ 506 to encapsulate the MTJ 506.

In some embodiments, the hard mask 504 may be, but is not limited to, a slow IBE etching conductor. For example, the hard mask 504 may include one or more layers of Ta, TaN, Ru, and/or W.

The MRAM cells 500 may be hardware biased by changing the critical dimension (e.g., size or area) of the bottom contact 510 and the magnetic liner 512. For example, the first MRAM cell 500A may have a first bias condition based on its relatively large bottom contact 510 and magnetic liner 512. As discussed in more detail below with respect to FIG. 8, the first MRAM cell 500A may be biased such that it is relatively easy to write to a high state (e.g., 1). Meanwhile, the third MRAM cell 500C, which has the smallest bottom contact 510 and magnetic liner 512 may be the easiest MRAM cell 500 to write to a low state (e.g., to a 0), while the second MRAM cell 500B, which has a critical dimension somewhere between the first MRAM cell 500A and the third MRAM cell 500C, may fall somewhere between the other two. In other words, the second MRAM cell 500B may be easier to write low but harder to write high than the first MRAM cell 500A and easier to write high but harder to write low than the third MRAM cell 500C.

Referring now to FIG. 6, shown is a cross-sectional view depicting a second example MRAM cell structure for selectively biasing the MRAM cell 600, in accordance with embodiments of the present disclosure. In particular, FIG. 6 shows three different MRAM cells 600 of the same basic structure, with each of the MRAM cells 600 having a different bias condition. The embodiment(s) shown in FIG. 6 include a structure with an external magnetic underlayer (EMU) liner underneath the MTJ combined with different critical dimensions of the MTJs. The bottom contact liner is comprised of a ferromagnetic liner, and the MTJ critical dimension variation, along with the different size of the EMU, require different current or voltage for the write/read of each cell.

The MRAM cells 600 may be substantially similar to the MRAM cells 500 discussed with respect to FIG. 5. In particular, each MRAM cell 600 includes a top contact 602, a hard mask 604, an MTJ 606, a diffusion barrier 608, a bottom contact 610, and a magnetic liner 612. Each of these components may be substantially similar to, or the same as, the corresponding components in FIG. 5. For example, in some embodiments, the MTJ 606 includes the same sub-components and arrangement thereof as the MTJ 506 discussed above.

Notably different from the MRAM cells 500, however, is that the MRAM cells 600 may be hardware biased by changing the critical dimension (e.g., size or area) of the entire stack other than the top contact. In other words, the MRAM cells 500 can be biased by changing the size of the hard mask 604, the MTJ 606, the diffusion barrier 608, the bottom contact 610, and the magnetic liner 612, collectively referred to herein as the MRAM stack. For example, the first MRAM cell 600A may have a first bias condition based on its relatively large MRAM stack. Accordingly, the first MRAM cell 600A may be biased such that it is relatively easy to write to a high state (e.g., 1). Meanwhile, the third MRAM cell 600C, which has the smallest MRAM stack may be the easiest MRAM cell 600 to write to a low state (e.g., to a 0), while the second MRAM cell 600B, which has a critical dimension somewhere between the first MRAM cell 600A and the third MRAM cell 600C, may fall somewhere between the other two. In other words, the second MRAM cell 600B may be easier to write low but harder to write high than the first MRAM cell 600A and easier to write high but harder to write low than the third MRAM cell 600C.

Referring now to FIG. 7, shown is a cross-sectional view depicting a third example MRAM cell structure for selectively biasing the MRAM cell, in accordance with embodiments of the present disclosure. In particular, FIG. 7 shows three different MRAM cells 700 of the same basic structure, with each of the MRAM cells 700 having a different bias condition. The embodiment(s) shown in FIG. 6 include a structure with an EMU with a magnetic fill underneath the MTJ. The bottom contact metal fill is comprised of ferromagnetic material and exerts magnetic field on MTJ. Varying the size of the magnetic fill also varies the magnetic bias exerted on each MTJ, thereby biasing each cell differently. This causes each MRAM cell to have a different write/read voltage to program the MRAM cell.

The MRAM cells 700 may be substantially similar to the MRAM cells 500 discussed with respect to FIG. 5. In particular, each MRAM cell 700 includes a top contact 702, a hard mask 704, an MTJ 706, a diffusion barrier 708, a bottom contact 610. Each of these components may be substantially similar to, or the same as, the corresponding components in FIG. 5. For example, in some embodiments, the MTJ 706 includes the same subcomponents and arrangement thereof as the MTJ 506 discussed above.

Notably different from the MRAM cells 500, however, is that the MRAM cells 700 may not have a distinct magnetic liner. Instead, the entire bottom contact 710 may be made of a ferromagnetic material. In some embodiments, the ferromagnetic material used in the bottom contact 710 may make up the bulk of the bottom contact 710, which may also contain some other metal(s) (e.g., for electrical conductivity).

The MRAM cells 700 may be hardware biased by changing the critical dimension (e.g., size or area) of the bottom contact 710. For example, the first MRAM cell 700A may have a first bias condition based on its relatively large bottom contact 710. Accordingly, the first MRAM cell 700A may be biased such that it is relatively easy to write to a high state (e.g., 1). Meanwhile, the third MRAM cell 700C, which has the smallest bottom contact 710 may be the easiest MRAM cell 700 to write to a low state (e.g., to a 0), while the second MRAM cell 700B, which has a critical dimension somewhere between the first MRAM cell 700A and the third MRAM cell 700C, may fall somewhere between the other two. In other words, the second MRAM cell 700B may be easier to write low but harder to write high than the first MRAM cell 700A and easier to write high but harder to write low than the third MRAM cell 700C.

Figure 8:
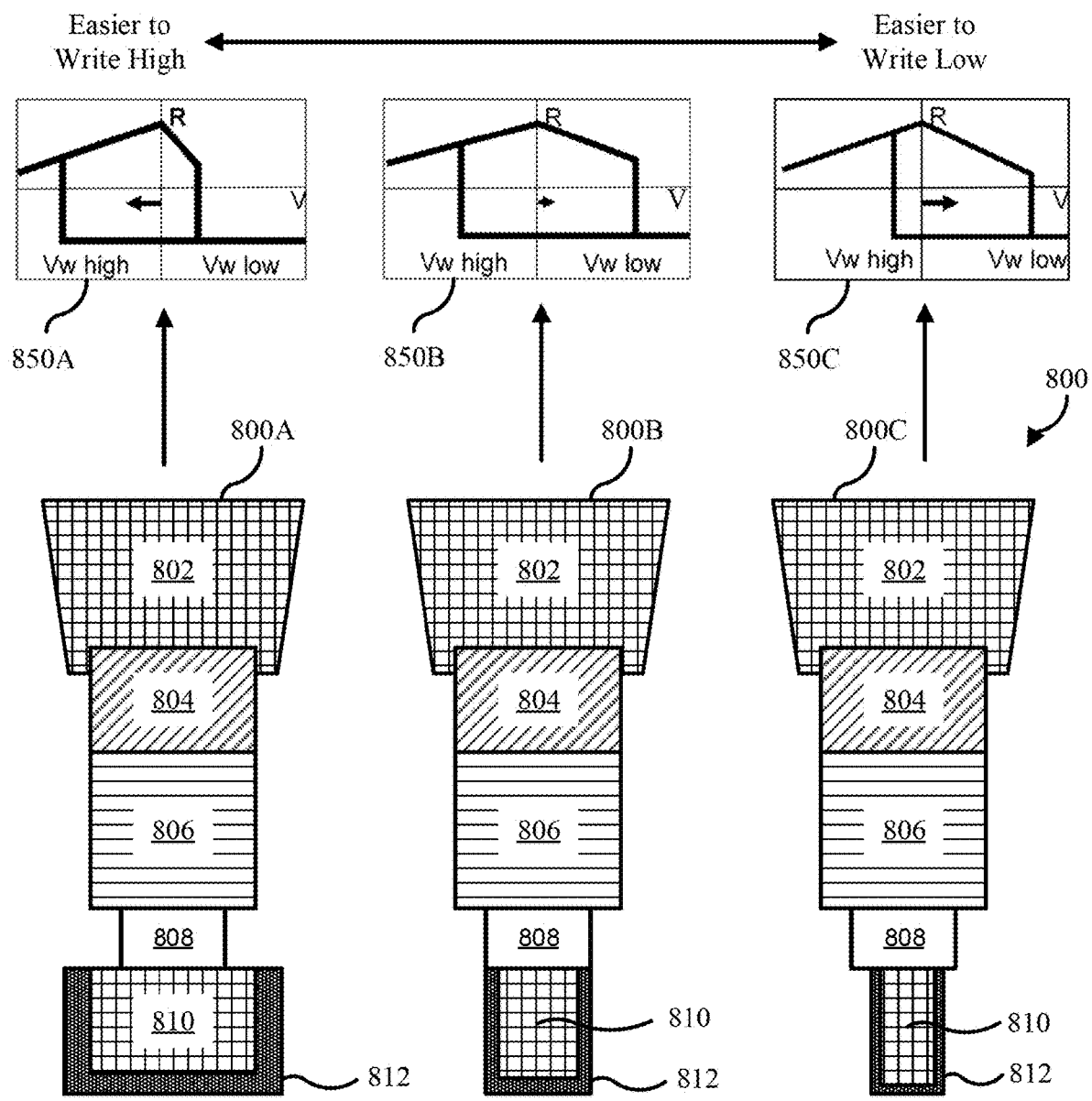
FIG. 8 is a diagram depicting the effect of different bottom contact dimensions of the first example MRAM cell structure on the programming voltage for the MRAM cell, in accordance with embodiments of the present disclosure.

Referring now to FIG. 8, shown is a diagram depicting the effect of different bottom contact dimensions of the first example MRAM cell structure on the programming voltage for the MRAM cells 800, in accordance with embodiments of the present disclosure. The MRAM cells 800 may be substantially similar to, or the same as, the MRAM cells 500 shown in FIG. 5. In particular, each MRAM cell 800 includes a top contact 802, a hard mask 804, an MTJ 806, a diffusion barrier 808, a bottom contact 810, and a magnetic liner 812. Each of these components may be substantially similar to, or the same as, the corresponding components in FIG. 5. For example, in some embodiments, the MTJ 806 includes the same subcomponents and arrangement thereof as the MTJ 506 discussed above.

Each MRAM cell 800 has a corresponding graph showing how easy it is to write the MRAM cell 800 to a high state of a low state. For example, the first graph 850A shows the voltage required to write the first MRAM cell 800A high and low, the second graph 850B shows the voltage required to write the second MRAM cell 800B high and low, and the third graph 850C shows the voltage required to write the third MRAM cell 800C high and low.

As shown in the first graph 850, the large magnetic liner 812 of the first MRAM cell 800A relative to the second MRAM cell 800B shifts the voltage curve to the left. This results in making it easier to write the first MRAM cell 800A to the high state. Similarly, the small magnetic liner 812 of the third MRAM cell 800C relative to the second MRAM cell 800B shifts the voltage curve in the third graph 850C to the right, resulting in a MRAM cell 800C that is biased towards the low state. These changes are a result of the bias field imposed on the MTJ by the magnetic liners 812. Tuning the size of the magnetic liners 812, with or without corresponding changes in the bottom contact 810, can therefore be used to tune the voltage bias of the MRAM cells 800.

Figure 9:
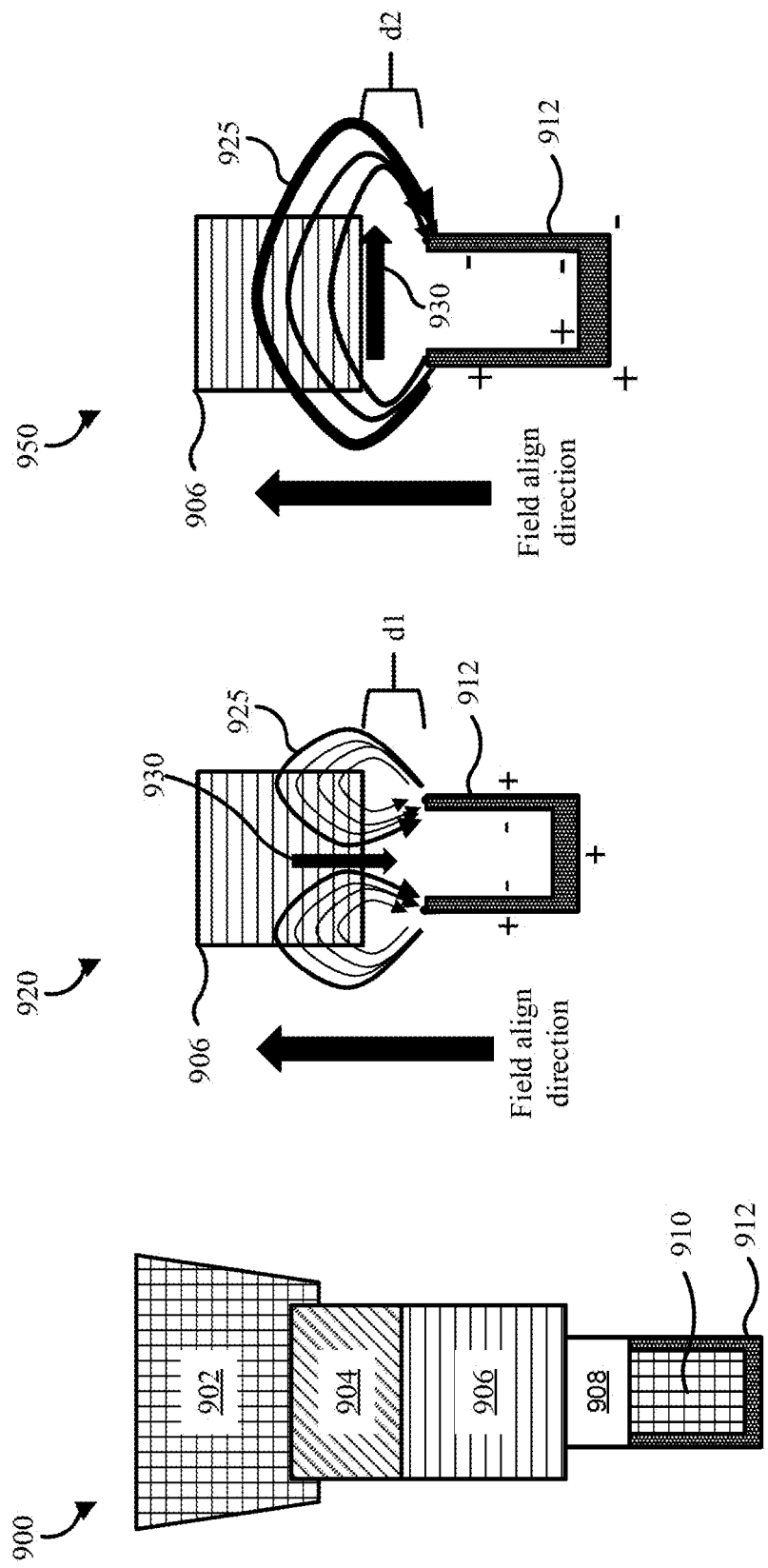
FIG. 9 illustrates magnetic field lines of an MRAM cell that has an external magnetic underlayer (EMU) liner on the bottom contact, in accordance with embodiments of the present disclosure.

Referring now to FIG. 9, illustrated are magnetic field lines 925 of an MRAM cell 900 that has an external magnetic underlayer (EMU) liner 912 on the bottom contact 910, in accordance with embodiments of the present disclosure. The MRAM cells 900 may be substantially similar to, or the same as, the MRAM cells 500 shown in FIG. 5. In particular, the MRAM cell 900 includes a top contact 902, a hard mask 904, an MTJ 906, a barrier 908 (also known as a diffusion barrier), a bottom contact 910, and a magnetic liner 912. Each of these components may be substantially similar to, or the same as, the corresponding components in FIG. 5. For example, in some embodiments, the MTJ 906 includes the same subcomponents and arrangement thereof as the MTJ 506 discussed above.

The magnetic layers in the stack are affected by magnetic dipole interactions between layers, as shown in the magnetic field graphs 920, 950. In particular, the free layer and/or reference layer fields are influenced by the external magnetic underlayer.

The first magnetic field graph 920 shows the magnetic field lines 925 when the magnetic liner 912 is magnetized such that the magnetic poles are on the inside (e.g., the negative pole) and outside (e.g., the positive pole) of the liner 912. As shown in FIG. 9, the magnetic fields 925 in this case exit from a prong of the magnetic liner 912, go through the MTJ 906, and return to the same prong of the magnetic liner 912. The field align direction goes up (i.e., towards the MTJ 906), and the net field impact 930 of the EMU is opposite the align direction (i.e., down, away from the MTJ 906). The magnetic field strength of the dipole ($H_{dipole}$) is ~10-1000 oersteds (Oe). Accordingly, the thickness d1 of the diffusion barrier 908 needs to be less than approximately 10 nm.

In contrast, the second magnetic field graph 950 shows the magnetic field lines 925 when the magnetic liner 912 is magnetized such that the magnetic poles are on the left and right sides of the liner 912. In other words, each vertical prong of the liner 912 is a different pole, with the left prong being the positive pole and the right prong being the negative pole. As shown in FIG. 9, the effect of this dipole arrangement is that the magnetic field lines 925 go from one pole (i.e., the left, positive prong) to the other (i.e., the right, negative pole). This results in a net field impact 930 of the EMU being perpendicular to the field align direction (e.g., in this case, the net field impact 930 is to the right). Again assuming that the magnetic field strength of the dipole ($H_{dipole}$) is ~10-1000 oersteds (Oe), the thickness d2 of the diffusion barrier 908 needs to be less than approximately 5 times the thickness of the liner 912.

Figure 10:
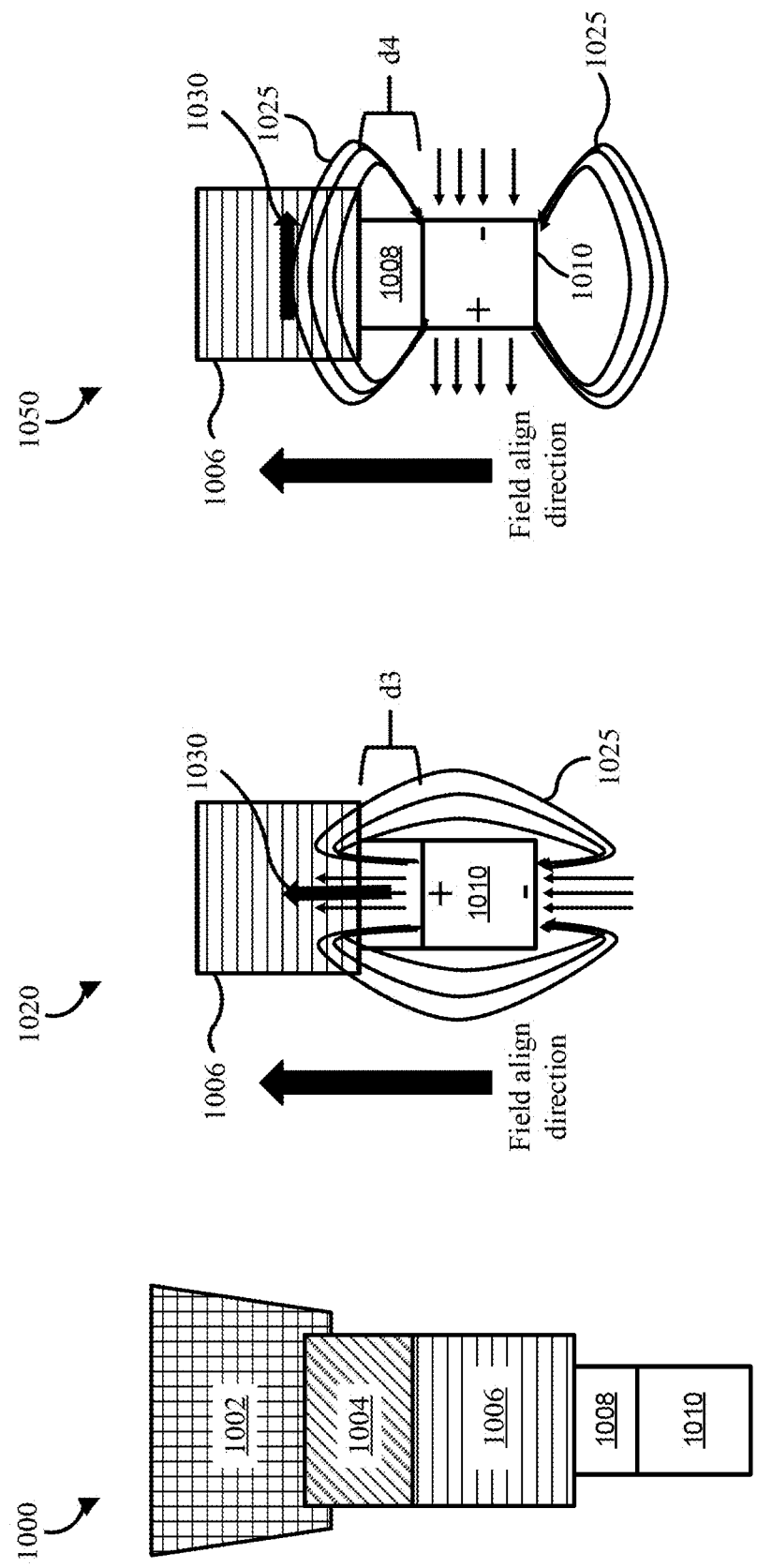
FIG. 10 illustrates magnetic field lines of an MRAM cell that has an EMU fill for a bottom contact, in accordance with embodiments of the present disclosure.

Referring now to FIG. 10, illustrated are magnetic field lines 1025 of an MRAM cell 1000 that has an EMU fill for a bottom contact 1012, in accordance with embodiments of the present disclosure. The MRAM cells 1000 may be substantially similar to, or the same as, the MRAM cells 700 shown in FIG. 7. In particular, the MRAM cell 1000 includes a top contact 1002, a hard mask 1004, an MTJ 1006, a diffusion barrier 1008, a bottom contact 1010. Each of these components may be substantially similar to, or the same as, the corresponding components in FIG. 7. For example, in some embodiments, the MTJ 1006 includes the same subcomponents and arrangement thereof as the MTJ 706 discussed above.

The magnetic layers in the stack are affected by magnetic dipole interactions between layers, as shown in the magnetic field graphs 1020, 1050. In particular, the free layer and/or reference layer fields are influenced by the external magnetic underlayer (e.g., the bottom contact with magnetic fill).

The first magnetic field graph 1020 shows the magnetic field lines 1025 when the magnetic bottom contact 1010 is magnetized such that the magnetic poles are on the bottom (e.g., the negative pole) and top (e.g., the positive pole) of the bottom contact 1010. As shown in FIG. 10, the magnetic fields 1025 in this case exit from the top of the bottom contact 1010, go through the MTJ 1006, and return to the bottom of the bottom contact 1010. The field align direction goes up (i.e., towards the MTJ 1006), and the net field impact 930 of the EMU is also in the same direction the align direction (i.e., up, towards from the MTJ 1006). The magnetic field strength of the dipole ($H_{dipole}$) is ~10-1000 oersteds (Oe). Accordingly, the thickness d3 of the diffusion barrier 1008 needs to be less than approximately 5 times the thickness of the magnetic fill of the bottom contact.

In contrast, the second magnetic field graph 1050 shows the magnetic field lines 1025 when the magnetic bottom contact 1010 is magnetized such that the magnetic poles are on the left and right sides of the bottom contact. In other words, each horizontal side of the bottom contact 1010 is a different pole, with the left side being the positive pole and the right side being the negative pole. As shown in FIG. 10, the effect of this dipole arrangement is that the magnetic field lines 1025 go from one pole (i.e., the left, positive side) to the other (i.e., the right, negative side). This results in a net field impact 1030 of the EMU being perpendicular to the field align direction (e.g., in this case, the net field impact 1030 is to the right). Again assuming that the magnetic field strength of the dipole ($H_{dipole}$) is ~10-1000 oersteds (Oe), the thickness d4 of the diffusion barrier 1008 needs to be less than approximately 5 times the critical dimension of the bottom contact.

Figure 11A:
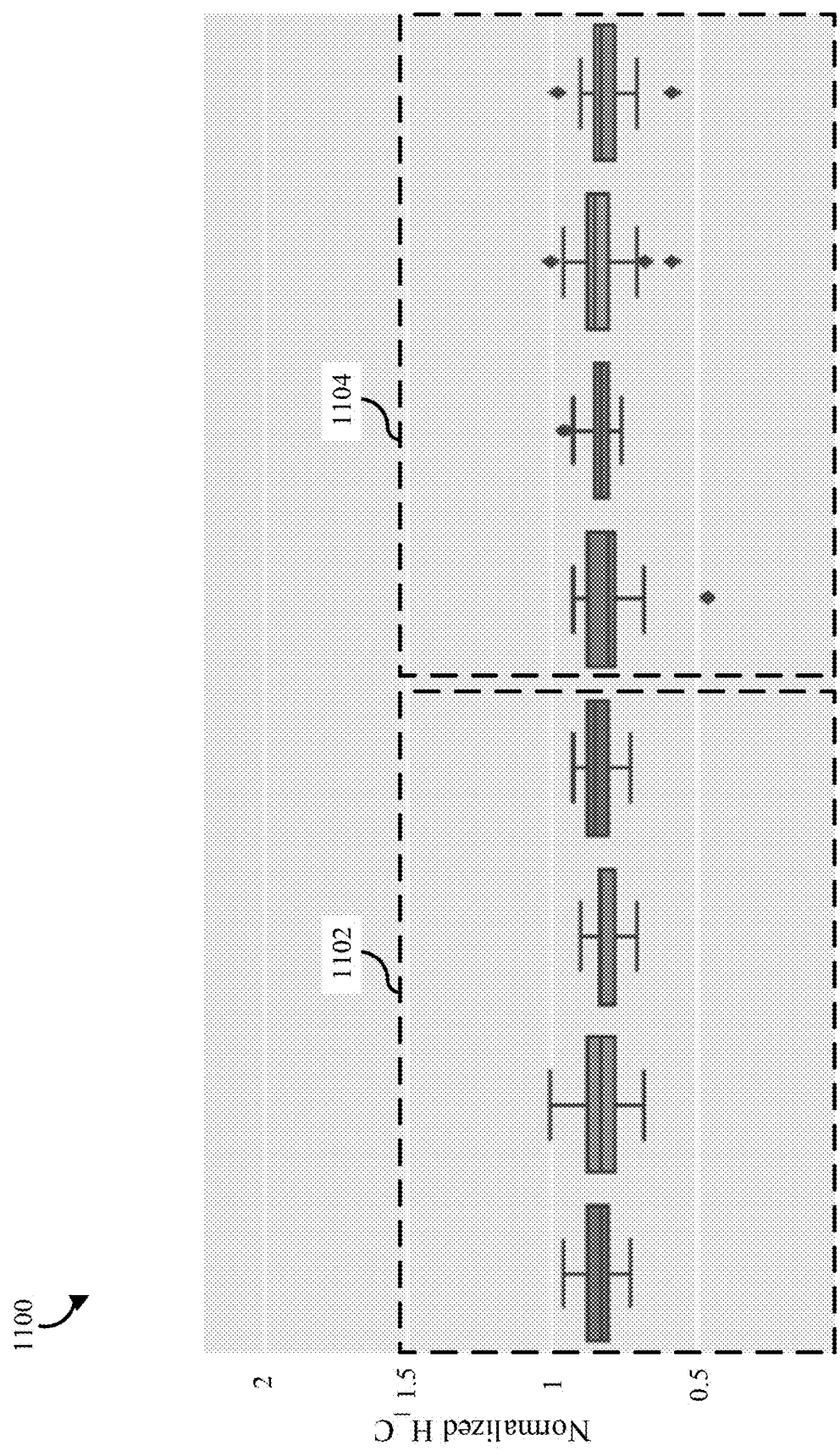
FIG. 11A is a graph of experimental results showing that the addition of a Co DAL does not change the effective perpendicular anisotropy field of the free layer in a magnetic tunnel junction (MTJ) element, in accordance with embodiments of the present disclosure.

Referring now to FIG. 11A, shown is a graph 1100 of experimental results showing that the addition of a Co dielectric adhesion layer (DAL) does not change the effective perpendicular anisotropy field of the free layer in an MTJ element, in accordance with embodiments of the present disclosure. In the graph 1100, a Co DAL was added to the MTJ in the stacks shown in box 1102, while the stacks shown in box 1104 included a non-magnetic liner. As can be seen from the graph 1100, the inclusion of the Co DAL did not change the field strength of the perpendicular anisotropy field of the free layer (H_C) relative to those that only had a non-magnetic liner.

Figure 11B:
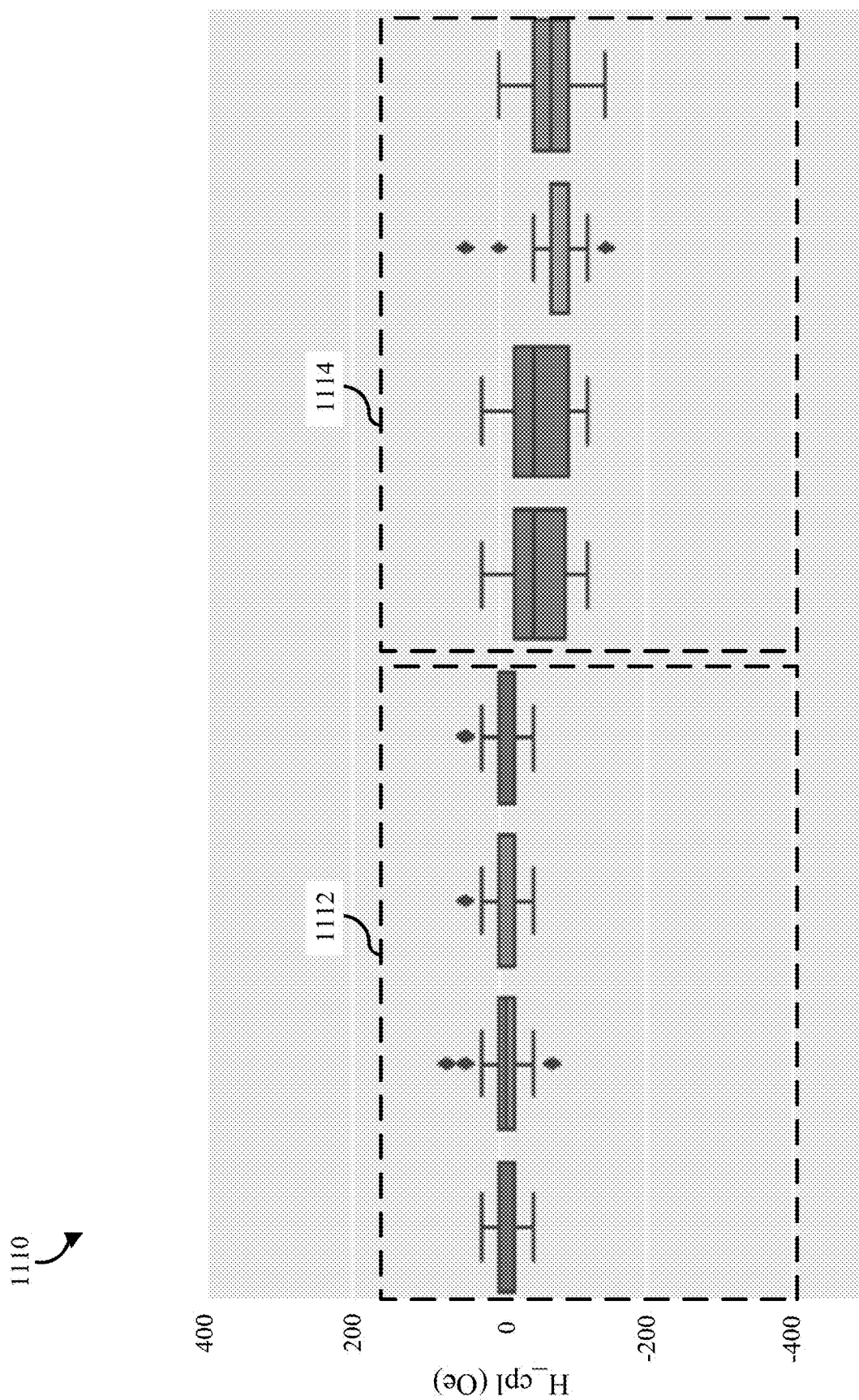
FIG. 11B is a graph of experimental results showing that the addition of a Co DAL reduces the stray magnetic field from the fixed layer to the free layer in an MTJ element to approximately zero, in accordance with embodiments of the present disclosure.

Referring now to FIG. 11B, shown is a graph 1110 of experimental results showing that the addition of a Co DAL reduces the stray magnetic field from the fixed layer to the free layer in an MTJ element to approximately zero, in accordance with embodiments of the present disclosure. In the graph 1110, a Co DAL was added to the MTJ in the stacks shown in box 1112, while the stacks shown in box 1114 included a non-magnetic liner. As can be seen from the graph 1100, the inclusion of the Co DAL significantly reduces the strength of the stray magnetic field (H_cpl) relative to those that only had a non-magnetic liner.

As can be seen from FIGS. 11A and 11B, the inclusion of a magnetic liner, in this example the Co DAL, has the desired effect of reducing stray magnetic fields without reducing the strength of the effective perpendicular anisotropy field.

Figure 12:
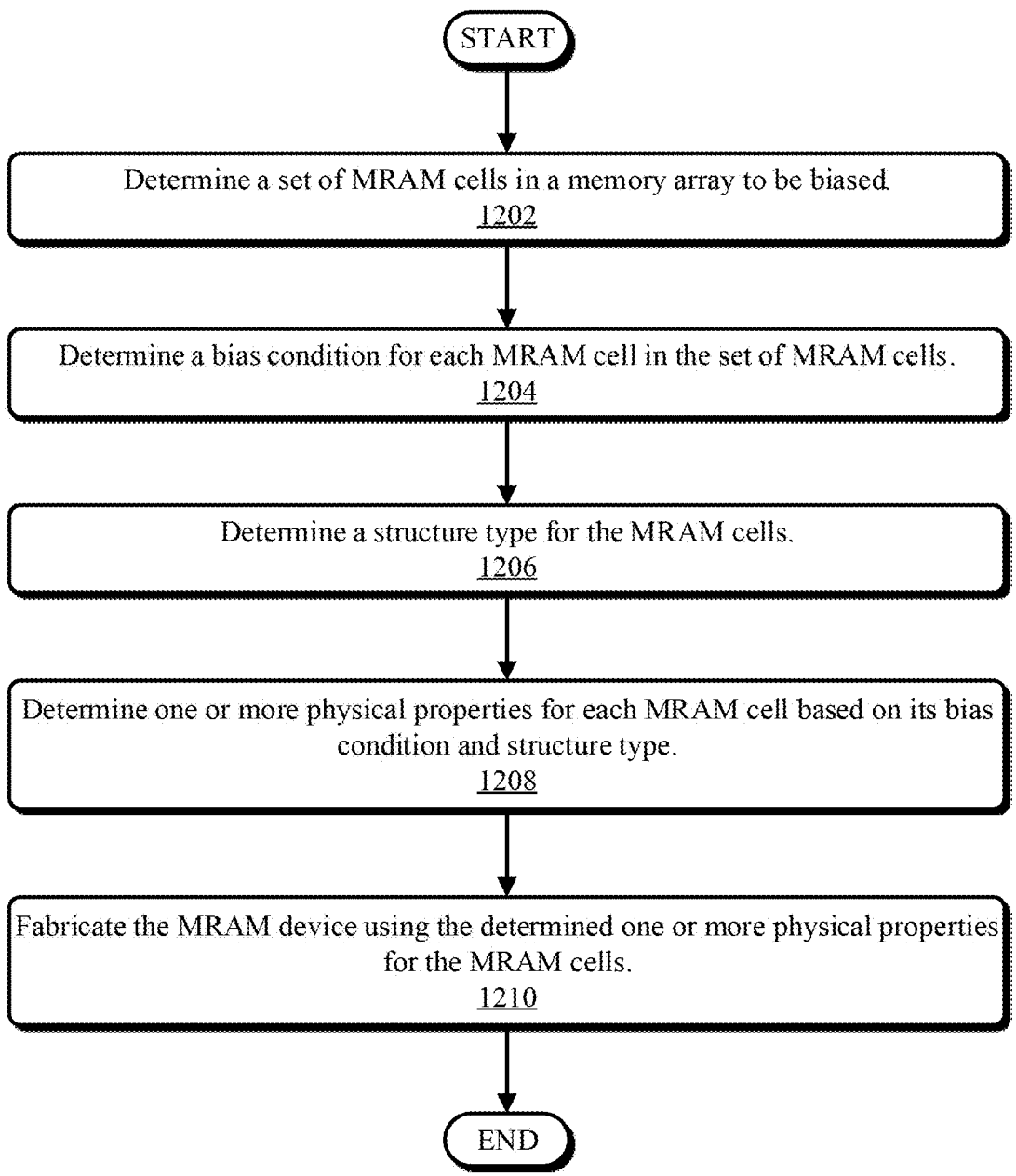
FIG. 12 illustrates a flowchart of an example method for selectively biasing an array of MRAM cells, in accordance with embodiments of the present disclosure.

Referring now to FIG. 12, illustrated is a flowchart of an example method 1200 for selectively biasing an array of MRAM cells, in accordance with embodiments of the present disclosure. One or more operations of the method 1200 may be performed automatically by a computer system. Accordingly, at least parts of the method 1200 can be embodied in software, hardware, firmware, or any combination thereof. The method begins at operation 1202, in which a set of MRAM cells to be biased are determined.

As disclosed herein, the MRAM cells that should be biased can be determined based on the intended application or use of the resulting MRAM device. For example, if the MRAM device is going to be used to store an AI model, some of the MRAM cells may be hardware biased so as to pre-bias the AI model stored therein. For example, if one or more nodes in the AI model are going to be biased, the corresponding MRAM cells (i.e., the cells that will store the biased nodes' data, such as their weights) may be determined at operation 1202. Similarly, if the MRAM device is going to store a security key, individual MRAM cells may be selectively biased based on what value or part of the security key they are going to include.

At operation 1204, a bias condition for each MRAM cell in the set of MRAM cells is determined. In some embodiments, only MRAM cells that are going to be hardware biased are considered as having a bias condition. In other embodiments, all MRAM cells, including those that will be fabricated normally, are considered to have a bias condition. In some embodiments, the bias condition for each MRAM cell can be (e.g., automatically by a processor) determined or selected from a predetermined list based on the intended use of the MRAM device. For example, if the MRAM device is to contain an AI model, there may be a plurality of biased nodes in the AI model. However, each biased node may not be identically biased. For example, some of the biased nodes may be biased high (i.e., more likely to be a larger number), while other nodes may be biased low (i.e., more likely to be a smaller number). Accordingly, some of the corresponding MRAM cells may be biased in one direction (e.g., low), while other MRAM cells may be biased in the other direction (e.g., high).

In some embodiments, determining the bias condition for the MRAM cells comprises grouping the MRAM cells into a plurality of subsets. Each subset may correspond to a particular bias condition. For example, a first subset of MRAM cells may include those cells that are to be biased towards a high value, while a second subset of MRAM cells may include those cells that are to be biased towards a low value.

At operation 1206, the structure type of the MRAM cells is determined. The structure type corresponds to a physical structure of the MRAM cells as well as how the MRAM cells are tuned (e.g., what parts of the MRAM cell are changed to bias them). For example, a first structure type may include an MTJ stack on top of a bottom contact that includes a liner. In this structure type, the MRAM cell may be tuned by either changing the size of the bottom contact and magnetic liner, by changing the size (e.g., thickness) of just the magnetic liner, or by changing the size of the entire MTJ stack and bottom contact/liner. A second structure type may include an MTJ stack on top of a bottom contact that is substantially made out of a magnetic material (e.g., has a magnetic material fill). As with the above, the MRAM cells having the second structure type may be tuned (e.g., selectively biased) by changing the size of the magnetic bottom contact, with or without corresponding changing to the size of the MTJ.

At operation 1208, one or more physical properties (e.g., critical dimensions) for each MRAM cell to be fabricated is determined. The one or more physical properties of an MRAM cell may be based on the bias condition and structure type for that MRAM cell. The one or more physical properties may correspond to the portions of the MRAM cell that are different under different bias conditions. For example, in embodiments that rely on the magnetic liner, the one or more physical properties may include a thickness of the magnetic liner and bottom contact. In this example, and as shown in FIG. 8, an MRAM cell that is to be biased high may have a larger thickness than an MRAM cell that is to be biased low.

At operation 1210, the MRAM device is fabricated. Fabricating the MRAM device may include using known fabrication methods and processes to form MRAM cells having different critical dimensions based on the corresponding bias conditions. After the MRAM device is fabricated, the method 1200 ends.

Figure 13:
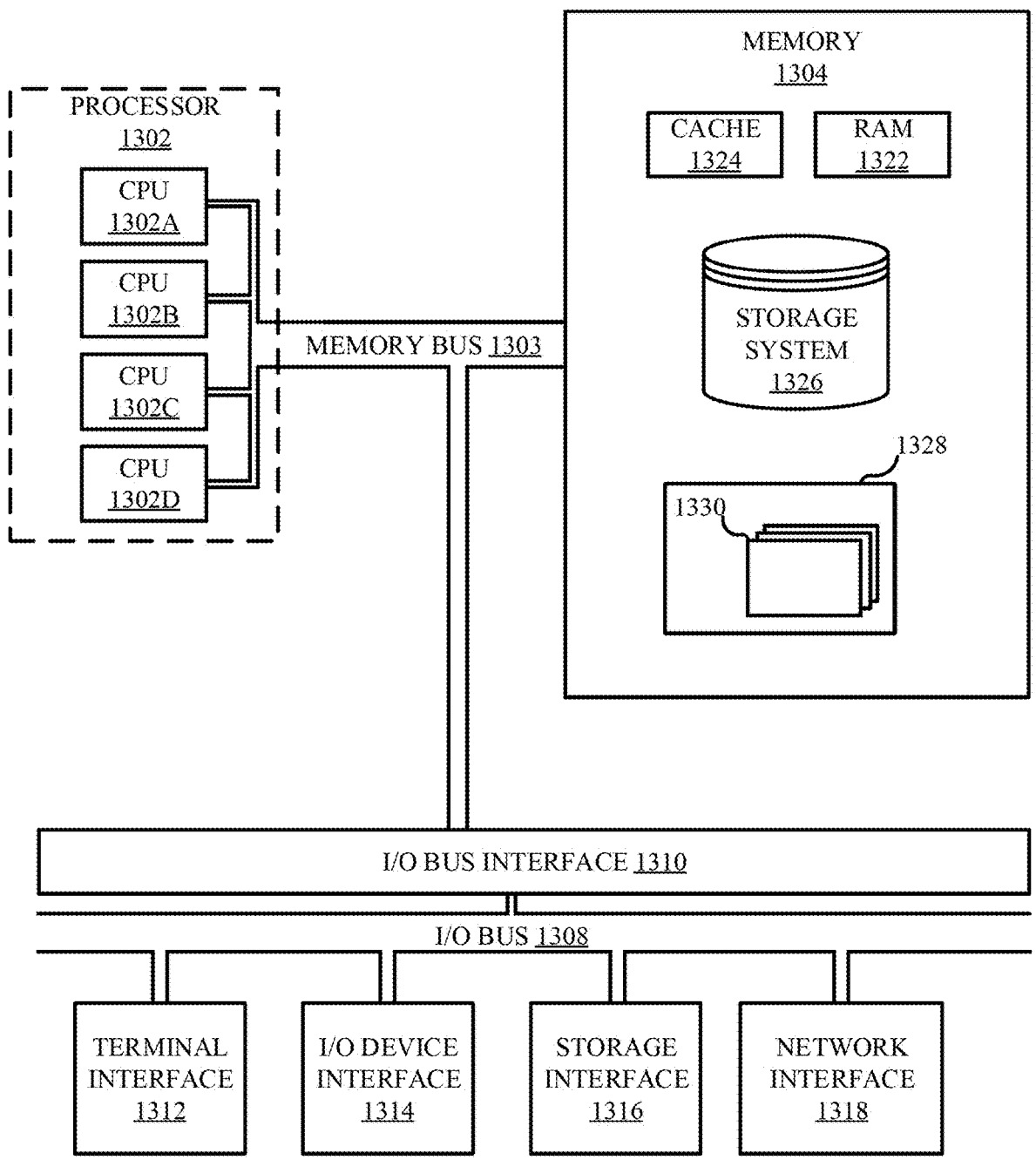
FIG. 13 illustrates a high-level block diagram of an example computer system that may be used in implementing one or more of the methods, tools, and modules, and any related functions, described herein, in accordance with embodiments of the present disclosure.

Referring now to FIG. 13, shown is a high-level block diagram of an example computer system 1301 that may be used in implementing one or more of the methods, tools, and modules, and any related functions, described herein (e.g., using one or more processor circuits or computer processors of the computer), in accordance with embodiments of the present disclosure. In some embodiments, the major components of the computer system 1301 may comprise one or more CPUs 1302, a memory subsystem 1304, a terminal interface 1312, a storage interface 1316, an I/O (Input/Output) device interface 1314, and a network interface 1318, all of which may be communicatively coupled, directly or indirectly, for inter-component communication via a memory bus 1303, an I/O bus 1308, and an I/O bus interface unit 1310.

The computer system 1301 may contain one or more general-purpose programmable central processing units (CPUs) 1302A, 1302B, 1302C, and 1302D, herein generically referred to as the CPU 1302. In some embodiments, the computer system 1301 may contain multiple processors typical of a relatively large system; however, in other embodiments the computer system 1301 may alternatively be a single CPU system. Each CPU 1302 may execute instructions stored in the memory subsystem 1304 and may include one or more levels of on-board cache.

System memory 1304 may include computer system readable media in the form of volatile memory, such as random access memory (RAM) 1322 or cache memory 1324. Computer system 1301 may further include other removable/non-removable, volatile/non-volatile computer system storage media. By way of example only, storage system 1326 can be provided for reading from and writing to a non-removable, non-volatile magnetic media, such as a "hard drive." Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM or other optical media can be provided. In addition, memory 1304 can include flash memory, e.g., a flash memory stick drive or a flash drive. Memory devices can be connected to memory bus 1303 by one or more data media interfaces. The memory 1304 may include at least one program product having a set (e.g., at least one) of program modules that are configured to carry out the functions of various embodiments.

One or more programs/utilities 1328, each having at least one set of program modules 1330 may be stored in memory 1304. The programs/utilities 1328 may include a hypervisor (also referred to as a virtual machine monitor), one or more operating systems, one or more application programs, other program modules, and program data. Each of the operating systems, one or more application programs, other program modules, and program data or some combination thereof, may include an implementation of a networking environment. Program modules 1330 generally perform the functions or methodologies of various embodiments.

Although the memory bus 1303 is shown in FIG. 13 as a single bus structure providing a direct communication path among the CPUs 1302, the memory subsystem 1304, and the I/O bus interface 1310, the memory bus 1303 may, in some embodiments, include multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 1310 and the I/O bus 1308 are shown as single respective units, the computer system 1301 may, in some embodiments, contain multiple I/O bus interface units 1310, multiple I/O buses 1308, or both. Further, while multiple I/O interface units are shown, which separate the I/O bus 1308 from various communications paths running to the various I/O devices, in other embodiments some or all of the I/O devices may be connected directly to one or more system I/O buses.

In some embodiments, the computer system 1301 may be a multi-user mainframe computer system, a single-user system, or a server computer or similar device that has little or no direct user interface, but receives requests from other computer systems (clients). Further, in some embodiments, the computer system 1301 may be implemented as a desktop computer, portable computer, laptop or notebook computer, tablet computer, pocket computer, telephone, smart phone, network switches or routers, or any other appropriate type of electronic device.

It is noted that FIG. 13 is intended to depict the representative major components of an exemplary computer system 1301. In some embodiments, however, individual components may have greater or lesser complexity than as represented in FIG. 13, components other than or in addition to those shown in FIG. 13 may be present, and the number, type, and configuration of such components may vary. Furthermore, the modules are listed and described illustratively according to an embodiment and are not meant to indicate necessity of a particular module or exclusivity of other potential modules (or functions/purposes as applied to a specific module).

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100*a*, 100*b*, 100*c*) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications, alterations, and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s). Additionally, it is intended that the following claim(s) be interpreted as covering all such alterations and modifications as fall within the true spirit and scope of the invention.

Example Embodiments

A non-limiting list of example embodiments are provided hereinafter to demonstrate some aspects of the present disclosure.

Example embodiment 1 is a magnetoresistive random-access memory (MRAM) cell, the MRAM cell. The MRAM cell includes a top contact, a hard mask layer below the top contact, a magnetic tunnel junction (MTJ) below the hard mask layer, a diffusion barrier below the MTJ, a bottom contact below the diffusion barrier, and a magnetic liner arranged around the bottom contact.

Example embodiment 2 includes the MRAM cell of example embodiment 1, including or excluding optional features. In this example embodiment, a size of the bottom contact and magnetic liner for the MRAM cell is based on a desired bias condition of the MRAM cell.

Example embodiment 3 includes the MRAM cell of any one of example embodiments 1 to 2, including or excluding optional features. In this example embodiment, a size of the MTJ, the bottom contact, and the magnetic liner for the MRAM cell is based on a desired bias condition of the MRAM cell.

Example embodiment 4 includes the MRAM cell of any one of example embodiments 1 to 3, including or excluding optional features. In this example embodiment, the MRAM cell is part of a memory array comprising a plurality of MRAM cells. The plurality of MRAM cells contain a first set of MRAM cells having a bottom contact and magnetic liner with a first critical dimension and a second set of MRAM cells having a bottom contact and magnetic liner with a second critical dimension. Optionally, the first and second critical dimensions are different.

Example embodiment 5 includes the MRAM cell of any one of example embodiments 1 to 4, including or excluding optional features. In this example embodiment, the MTJ includes a free layer, a reference layer, and a tunnel barrier disposed between the free layer and the reference layer. Optionally, the tunnel barrier is a layer of MgO.

Example embodiment 6 is a magnetoresistive random-access memory (MRAM) cell. The MRAM cell includes a top contact, a hard mask layer below the top contact, a magnetic tunnel junction (MTJ) below the hard mask layer, a diffusion barrier below the MTJ, and a bottom contact below the diffusion barrier. The bottom contact includes a ferromagnetic material fill.

Example embodiment 7 includes the MRAM cell of example embodiment 6, including or excluding optional features. In this example embodiment, a size of the MTJ and the bottom contact is based on a bias condition of the MRAM cell.

Example embodiment 8 includes the MRAM cell of any one of example embodiments 6 to 7, including or excluding optional features. In this example embodiment, the MRAM cell is part of a memory array comprising a plurality of MRAM cells. The plurality of MRAM cells contain a first set of MRAM cells having a bottom contact and magnetic liner with a first critical dimension and a second set of MRAM cells having a bottom contact and magnetic liner with a second critical dimension. Optionally, the first and second critical dimensions are different.

Example embodiment 9 includes the MRAM cell of any one of example embodiments 6 to 8, including or excluding optional features. In this example embodiment, the MTJ comprises a free layer, a reference layer, and a tunnel barrier disposed between the free layer and the reference layer. Optionally, the tunnel barrier is a layer of MgO.

Example embodiment 10 is a method of forming a magnetoresistive random-access memory (MRAM) device in which individual MRAM cells are selectively biased, the method. The method includes determining a set of MRAM cells in a memory array to be hardware biased. The method further includes determining, for each MRAM cell in the set of MRAM cells, a bias condition. The method further includes determining, for each MRAM cell in the set of MRAM cells, a critical dimension based on the bias condition of the MRAM cell and a type of structure for the MRAM cell. The method further includes fabricating the memory array using the determined critical dimension for each MRAM cell in the set of MRAM cells.

Example embodiment 11 includes the method of example embodiment 10, including or excluding optional features. In this example embodiment, the set of MRAM cells to be hardware biased is determined based on an intended use of the MRAM device. Optionally, the intended use of the MRAM device is selected from the group consisting of memory for an artificial intelligence (AI) model and memory containing a security key.

Example embodiment 12 includes the method of any one of example embodiments 10 to 11, including or excluding optional features. In this example embodiment, determining the bias condition for the set of MRAM cells comprises grouping the set of MRAM cells into a plurality of subsets. Each subset contains MRAM cells with a particular bias condition.

Example embodiment 13 includes the method of any one of example embodiments 10 to 12, including or excluding optional features. In this example embodiment, fabricating the MRAM device comprises forming a top contact for each MRAM cell in the MRAM device. Fabricating the MRAM device further comprises forming a hard mask below the top contact. Fabricating the MRAM device further comprises forming a MTJ below the hard mask. Fabricating the MRAM device further comprises forming a diffusion barrier below the MTJ. Fabricating the MRAM device further comprises forming a bottom contact below the diffusion barrier. Fabricating the MRAM device further comprises forming a magnetic liner around the bottom contact. A size of the bottom contact and magnetic liner for each respective MRAM cell is based on the bias condition of the respective MRAM cell.

Example embodiment 14 includes the method of any one of example embodiments 10 to 13, including or excluding optional features. In this example embodiment, fabricating the MRAM device comprises forming a top contact for each MRAM cell in the MRAM device. Fabricating the MRAM device further comprises forming a hard mask below the top contact. Fabricating the MRAM device further comprises forming a MTJ below the hard mask. Fabricating the MRAM device further comprises forming a diffusion barrier below the MTJ. Fabricating the MRAM device further comprises forming a bottom contact below the diffusion barrier. Fabricating the MRAM device further comprises forming a magnetic liner around the bottom contact. A size of the MTJ, the bottom contact, and the magnetic liner for each respective MRAM cell is based on the bias condition of the respective MRAM cell.

Example embodiment 15 includes the method of any one of example embodiments 10 to 14, including or excluding optional features. In this example embodiment, fabricating the MRAM device comprises forming a top contact for each MRAM cell in the MRAM device. Fabricating the MRAM device further comprises forming a hard mask below the top contact. Fabricating the MRAM device further comprises forming a MTJ below the hard mask. Fabricating the MRAM device further comprises forming a diffusion barrier below the MTJ. Fabricating the MRAM device further comprises forming a bottom contact below the diffusion barrier, wherein the bottom contact is at least substantially made from a ferromagnetic material. A size of the MTJ and the bottom contact for each respective MRAM cell is based on the bias condition of the respective MRAM cell.

What is claimed is:

1. A magnetoresistive random-access memory (MRAM) cell, the MRAM cell comprising:
   a top contact;
   a hard mask layer below the top contact;
   a magnetic tunnel junction (MTJ) below the hard mask layer;
   a diffusion barrier below the MTJ;
   a bottom contact below the diffusion barrier; and
   a magnetic liner arranged around at least a portion of the bottom contact,
   wherein the MRAM cell is part of a memory array comprising a plurality of MRAM cells, the plurality of MRAM cells containing a first set of MRAM cells having a bottom contact and magnetic liner with a first critical dimension and a second set of MRAM cells having a bottom contact and magnetic liner with a second critical dimension that is different than the first critical dimension.

2. The MRAM cell of claim 1, wherein a size of the bottom contact and magnetic liner for the MRAM cell is based on a desired bias condition of the MRAM cell.

3. The MRAM cell of claim 1, wherein a size of the MTJ, the bottom contact, and the magnetic liner for the MRAM cell is based on a desired bias condition of the MRAM cell.

4. The MRAM cell of claim 1, wherein the MTJ comprises:
   a free layer;
   a reference layer; and
   a tunnel barrier disposed between the free layer and the reference layer.

5. The MRAM cell of claim 4, wherein the tunnel barrier is a layer of MgO.

6. The MRAM cell of claim 1, wherein the magnetic liner is magnetized such that the direction of a net magnetic field impact of the magnetic liner is parallel to the field align direction of the MTJ and magnetic liner.

7. The MRAM cell of claim 6, wherein the direction of the net magnetic field impact of the magnetic liner is opposite to the field align direction.

8. The MRAM cell of claim 1, wherein the magnetic liner is magnetized such that the direction of a net magnetic field impact of the magnetic liner is perpendicular to the field align direction of the MTJ and magnetic liner.

9. A memory array comprising:
   a first set of magnetoresistive random-access memory (MRAM) cells; and
   a second set of MRAM cells,
   wherein each MRAM cell of the first and second sets of MRAM cells comprises:
      a top contact;
      a magnetic tunnel junction (MTJ) below the top contact;
      a bottom contact below the MTJ; and
      a ferromagnetic liner arranged around at least a portion of the bottom contact;
   wherein the bottom contact and ferromagnetic liner of the first set of MRAM cells has a first critical dimension, and
   wherein the bottom contact and ferromagnetic liner of the second set of MRAM cells has a second critical dimension that is different than the first critical dimension.

10. The memory array of claim 9, wherein the MTJ comprises:
    a free layer;
    a reference layer; and
    a tunnel barrier disposed between the free layer and the reference layer.

11. The memory array of claim 10, wherein the tunnel barrier is a layer of MgO.

12. The memory array of claim 9, wherein the ferromagnetic liner is magnetized such that the direction of a net magnetic field impact of the ferromagnetic liner is parallel to the field align direction of the MTJ and ferromagnetic liner.

13. The memory array of claim 12, wherein the direction of the net magnetic field impact of the ferromagnetic liner is opposite to the field align direction.

14. The memory array of claim 9, wherein the ferromagnetic liner is magnetized such that the direction of a net magnetic field impact of the ferromagnetic liner is perpendicular to the field align direction of the MTJ and ferromagnetic liner.

\* \* \* \* \*